United States Patent [19]

Ebina

[11] Patent Number: 4,660,067
[45] Date of Patent: Apr. 21, 1987

[54] COMPLEMENTARY MOS INTEGRATED CIRCUIT HAVING MEANS FOR PREVENTING LATCH-UP PHENOMENON

[75] Inventor: Masaki Ebina, Tokyo, Japan
[73] Assignee: NEC Corporation, Tokyo, Japan
[21] Appl. No.: 760,452
[22] Filed: Jul. 30, 1985
[30] Foreign Application Priority Data Jul. 30, 1984 [JP] Japan .................................. 59-159802

[51] Int. Cl.⁴ ........................................... H01L 27/02
[52] U.S. Cl. ..................................... 357/42; 357/23.1; 357/41; 357/45
[58] Field of Search ...................... 357/42, 45, 23.1, 41

[56] References Cited

U.S. PATENT DOCUMENTS

| 4,062,039 | 12/1977 | Nishimura | 357/42 |
| 4,167,747 | 9/1979 | Satou | 357/42 |
| 4,270,262 | 6/1981 | Hori et al. | 357/41 |

Primary Examiner—Edward J. Wojciechowicz
Attorney, Agent, or Firm—Burns, Doane, Swecker & Mathis

[57] ABSTRACT

The complementary MOS integrated circuit has a first channel MOS FET in a substrate of one conductivity type and a second channel MOS FET in a well region of the other conductivity type, and further comprises a first high impurity region of the one conductivity type formed in the substrate so as to surround the first channel MOS FET, a second high inpurity region of the other conductivity type formed in the well region so as to surround the second channel MOS FET, a first insulator film covering the first and second high impurity regions and having a plurality of first holes, a first wiring layer formed on the first insulator film with connections with the first high impurity region through the first holes, so as to surround the first channel MOS FET, a second wiring layer formed on the first insulator film with connections with the second high impurity region through the second holes, so as to surround the second channel MOS FET, a second insulator film covering the first and second wiring layers and having a plurality of second holes, a third wiring layer formed on the second insulator film, connected with the first wiring layer through the second holes and supplied with a first power potential, and a fourth wiring layer formed on the second insulator film, connected with the second wiring layer through the second holes and supplied with a second power potential.

6 Claims, 5 Drawing Figures

COMPLEMENTARY MOS INTEGRATED CIRCUIT HAVING MEANS FOR PREVENTING LATCH-UP PHENOMENON

BACKGROUND OF THE INVENTION

1. Field of the Invention

This invention relates to a complementary type MOS integrated circuit device (hereinafter, referred to as a C-MOS IC) in which circuit is composed of N-channel type MOS field effect transistors (hereinafter, referred to as N-MOS FET's) and P-channel type MOS field effect transistors (hereinafter, referred to as P-MOS FET's), and more particularly to an improvement for preventing a latch-up phenomenon.

2. Description of the Prior Art

The C-MOS IC has an advantageous feature of consuming a very small power, but its fatal defect is the so-called latch-up phenomenon. The latch-up phenomenon lowers the impedance between power source terminals of the C-MOS IC chip to consume a very large power in the IC chip, with a result of a thermal breakdown of the IC chip.

This phenomenon will now be explained in more detail to some extent. The C-MOS IC has a well region of a conductivity type different from the conductivity type of the semiconductor substrate. In the well region and the substrate, MOS FET's of different channel types are respectively formed. Here, it is assumed to use P-type and N-type as the conductivity types of the well region and the substrate. The MOS FET's in the well region and the substrate are respectively N-channel type and P-channel type. The source region of the N-MOS FET, the well region and the substrate form a parasitic NPN bipolar transistor. The source region of the P-MOS FET, the substrate and the well region form a parasitic PNP bipolar transistor. The combination of these NPN and PNP bipolar transistors forms a parasitic PNPN thyristor.

The parasitic NPN bipolar transistor turns on in response to an application of noise to the drain of the N-MOS FET. The impedance component of the substrate, then, turns on the parasitic PNP transistor due to the collector current of the parasitic NPN transistor. The collector current of the PNP transistor is fed back to the NPN transistor so as to enhance the conductivity of the NPN transistor. As a result, the parasitic PNPN thyristor turns on to lower the impedance between the power source terminals electrically connected to the well region and the substrate.

The power source is applied to a P+ region formed in the well region through a bonding pad electrically connected thereto via a wiring layer on the IC chip. If the impedance of the wiring layer is small, the noise applied to the drain of the N-MOS FET causes a minority carrier injection into the emitter of the parasitic NPN transistor to turn on the same, but the collector current of the parasitic PNP transistor is effectively drained through the P+ region to the power source. The positive feedback of the collector current of the PNP transistor to the NPN transistor is restrained to prevent the parasitic PNPN thyristor from turning on.

However, since the wiring layer was connected with the limited portion of the P+ region in the prior art, some impedance was not avoidable in the wiring layer. This unavoidable impedance component allowed the positive feedback of the collector current of the parasitic PNP transistor to the parasitic NPN transistor, causing the turning-on of the parasitic PNPN thyristor. The turning-on condition cannot be reset to the cut-off condition so long as the power is continued to be supplied. Therefore, the latch-up phenomenon causes a thermal breakdown of the C-MOS IC.

SUMMARY OF THE INVENTION

It is a primary object of the present invention to provide a complementary MOS integrated circuit in which the latch-up phenomenon is effectively prevented.

It is a further object of the present invention to provide a complementary MOS integrated circuit having a multi-layer structure of metal layers in which a power supply voltage is applied to the well region with a reduced impedance.

According to the present invention, there is provided a complementary MOS integrated circuit comprising a semiconductor substrate of a one conductivity type, a well region formed in the substrate and having an opposite conductivity type to the one conductivity type, a first MOS field effect transistor formed in the well region and having a channel of one conductivity type, a second MOS field effect transistor formed in the substrate and having a channel of the opposite conductivity type, a first high impurity region formed in the well region so as to substantially surround the first MOS field effect transistor and having the opposite conductivity type, a second high impurity region of the one conductivity type formed in the substrate so as to substantially surround the second MOS field effect transistor, a first insulator covering the first and second high impurity regions and having a plurality of first holes exposing a plurality of contact portions of the first high impurity region and a plurality of second holes exposing a plurality of contact portions of the second high impurity region, a first conductive layer covering the first insulator and contacting with the first high impurity region through the first holes, the contact portions of the first conductive layer substantially surrounding the first MOS field effect transistor, a second conductive layer covering the first insulator and contacting with the second high impurity region through the second holes, the contact portions of the second conductive layer substantially surrounding the second MOS field effect transistor, a second insulator covering the first and second conductive layers and having a plurality of third holes exposing contact portions of the first conductive layer and a plurality of fourth holes exposing contact portions of the second conductive layer, a third conductive layer connected to a first power source terminal, covering the second insulator and contacting with the first conductive layer through the third holes, the contact portions of the third conductive layer substantially surrounding the first MOS field effect transistor, and a fourth conductive layer connected to a second power source terminal, covering the second insulator and contacting with the second conductive layer through the fourth holes, the contact portions of the fourth conductive layer substantially surrounding the second MOS field effect transistor.

The complementary MOS integrated circuit in accordance with the present invention is featured in that the first and second high impurity regions surround the first and second MOS field effect transistors, respectively, and the third and fourth conductive layers contact with a plurality of portions of each of the first and second high impurity regions through holes in the first and second insulators and via the first and second conductive layers. Therefore, every portions of the first and second high impurity regions are respectively connected with the first and second power supply terminals with very low impedance. If the parasitic bipolar transistors are turned on, the collector current is effectively drained through the first or second high impurity regions and first and third conductive layers or second and fourth conductive layers, to restrain the tuning-on of the parasitic PNPN thyristor. The latch-up plenomenon is thus effectively prevented.

In the multi-layer structure of the first and third (or second and fourth) conductive layers according to present invention, the upper-most (third or fourth) conductive layer is electrically connected to the high impurity region through the intermediate (first or second) conductive layer. Thicknesses of insulators between the upper-most and intermediate conductive layers and between the intermediate conductive layer and the high impurity region are about half of a field insulator. Therefore, the steps formed at the edges of the holes in the respective insulators are not sharp and the reliable connection between the upper-most conductive layer and the high impurity region is achieved.

BRIEF DESCRIPTION OF THE DRAWINGS

The above and further objects, features and advantages of the present invention will become more apparent from the following detailed description of embodiments taken in conjunction with the accompanying drawings, wherein.

Figure 1:
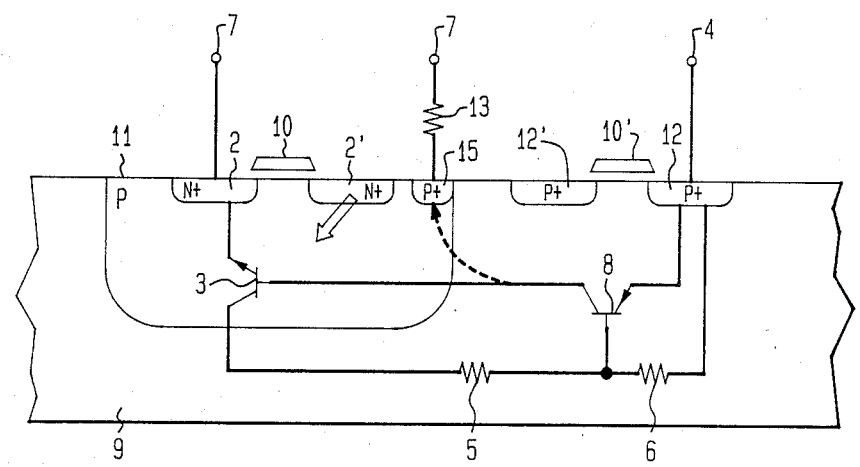
FIG. 1 is an explanatory sectional view of the complementary MOS integrated circuit in the prior art.

One of the conventional structures for preventing the latch-up phenomenon is explanatorily shown in FIG. 1 in which a high impurity region (15) clamped at a grounding potential or a power source voltage is interposed between a P-MOS FET and an N-MOS FET. More specifically, an N-type silicon substrate 9 has a P-type well region 11. In the P-type well region 11, N-type source and drain regions 2, 2' and a P+-type region 15 are formed. A gate electrode 10 is formed on the well region 11 between the source and drain regions 2 and 2' through a gate insulator film (not shown in FIG. 1) to form an N-channel MOS FET. In the substrate 9 outside the well-region 11, P+-type source and drain regions 12 and 12' are formed. A gate electrode 10' is formed on the substrate 9 between the source and drain regions 12 and 12' through another gate insulator film (not shown in FIG. 1) to form a P-channel MOS FET. The source region 2 and the P+-type region 15 are applied with a grounding potential through a terminal 7. The source region 12 is applied with a positive power source potential through a terminal 4. The impedance 13 between the P+-type region 15 and the terminal 7 is a component based on the wiring therebetween and play the most important role in the latch-up phenomenon.

The N+-type source 2, the P-well region 11 and the N-type substrate 9 form an NPN bipolar transistor 3. The P+-type source 12, the N-type substrate 9 and the P-well region 11 form a PNP bipolar transistor 8. The collector of the NPN transistor 3 is connected with the base of the PNP transistor 8 through an impedance component 5 of the substrate 9 and further connected with the P+-type source region 12 through an impedance component 6 of the substrate 9. The base of the NPN transistor 3 is the same region of the collector of the PNP transistor 8. Thus, the NPN and PNP transistors 3 and 8 form a PNPN thyristor in equivalent circuit.

If a noise is applied to the N+-type drain region 2' to forward bias the junction between the drain region 2' and the well region 11, a minority carrier injection occurs to turn on the NPN transistor 3. The collector current biases the PNP transistor 8 by the aid of the impedance components 5 and 6. The collector current of the PNP transistor 8 is fed back to the base of the NPN transistor 3. On the way of the feed-back path, there is a P+-type region 15 held at a grounding potential. Some part of carriers in the feed-back path is drained through the P+-type region 15. However, due to the presence of the impedance 13, a considerable part of carriers arrive at the base of the NPN transistor 3 and enhance the conductivity of the NPN transistor 3 to drive the NPN and PNP transistors 3 and 8 into the latch-up phenomenon. Since the P+-type region 15 is partially formed between the N-MOS FET and P-MOS FET, there is a limit to decrease the impedance 13 by arrangement of wiring between the P+-type region 15 and the terminal 7. Therefore, the latch-up phenomenon is not perfectly prevented by the conventional structure.

Another difficulty arises in the integrated circuit using a multi-layer wiring structure. In such structure, the grounding potential or power source potential is applied through the upper-most layer. If the upper-most layer is directly connected with the P+-type region 15 through a surface insulator film, a disconnection appears at the connecting portion due to the large step at the holes of the insulator film. This makes the attempt for preventing the latch-up phenomenon impossible.

DESCRIPTION OF THE PREFERRED EMBODIMENT

The preferred embodiment of the present invention is shown in FIGS. 2 to 5 in which a power P-MOS FET 100 and a power N-MOS FET 200 are respectively formed in an N-type silicon substrate 14 having an impurity concentration of $8 \times 10^{14}$ cm$^{-3}$ and a P-well region 17 having an impurity concentration of $1 \times 10^{16}$ cm$^{-3}$. N+-type source regions 16 and N+-type drain regions 16' are formed in the well region 17 with an impurity concentration of $1 \times 10^{20}$ cm$^{-3}$. P+-type region 19 is also formed in the well region 17 with an impurity concentration between $1 \sim 10 \times 10^{17}$, preferably $5 \times 10^{17}$ cm$^{-3}$, so as to surround the source and drain regions 16 and 16'. Similarly, P+-type source and drain regions 18 and 18' are formed in the substrate 14 outside the well region 17 with an impurity concentration of $1 \times 10^{20}$ cm$^{-3}$. N+-type region 36 is also formed in the substrate 14 with an impurity concentration between $1 \sim 10 \times 10^{17}$ cm$^{-3}$, preferably $5 \times 10^{17}$ cm$^{-3}$, so as to surround the source and drain regions 18 and 18'. Gate electrodes 21 are formed on the well region 17 between the source and drain regions 16 and 16' with silicon, thus formed the N-MOS FET 200. Other gate electrodes 22 are formed on the substrate 14 between the source and drain regions 18 and 18' with silicon, thus formed the P-MOS FET 100.

Figure 2:
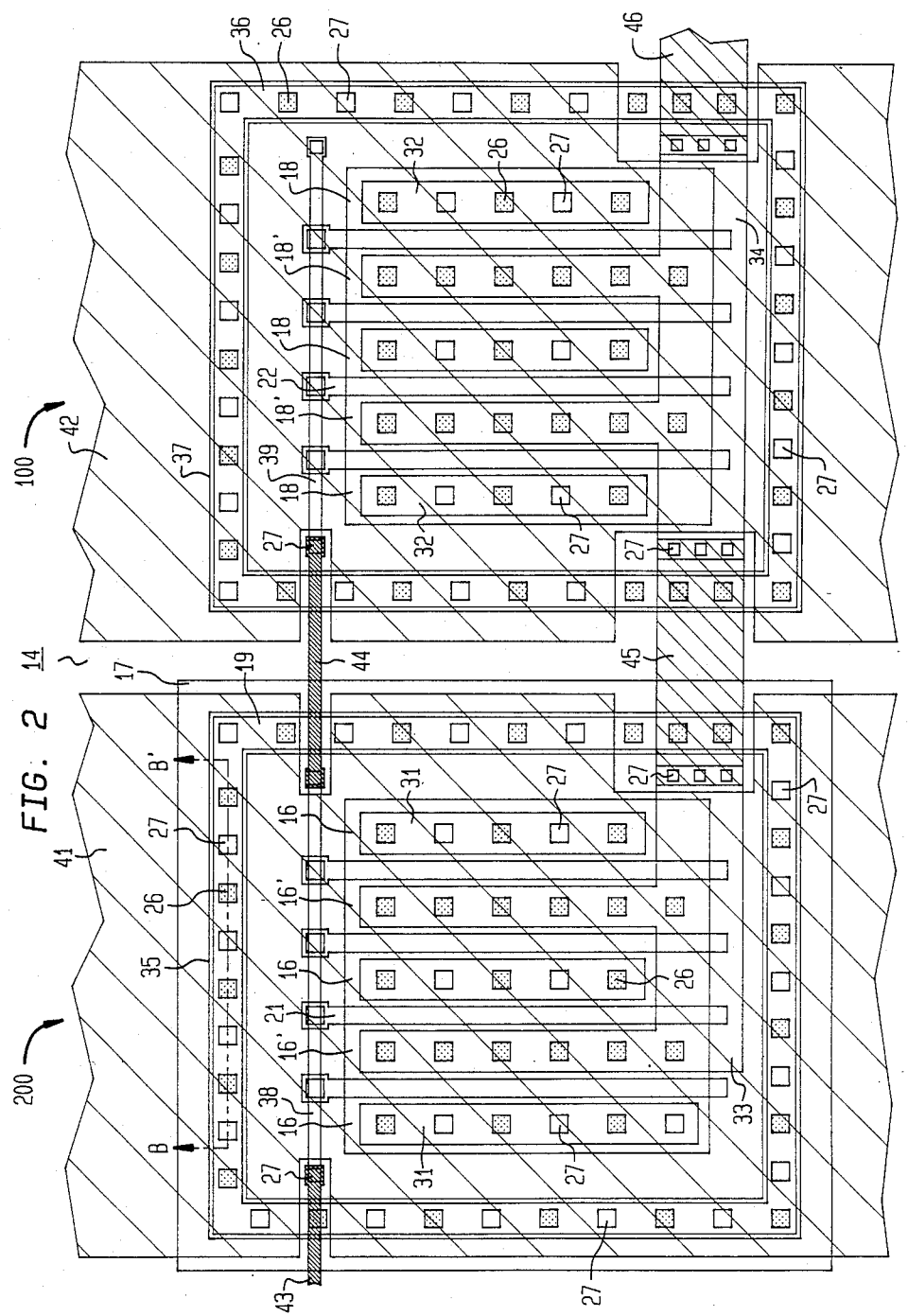
FIG. 2 is a plan view of the complementary MOS integrated circuit according to the present invention.
Figure 3:
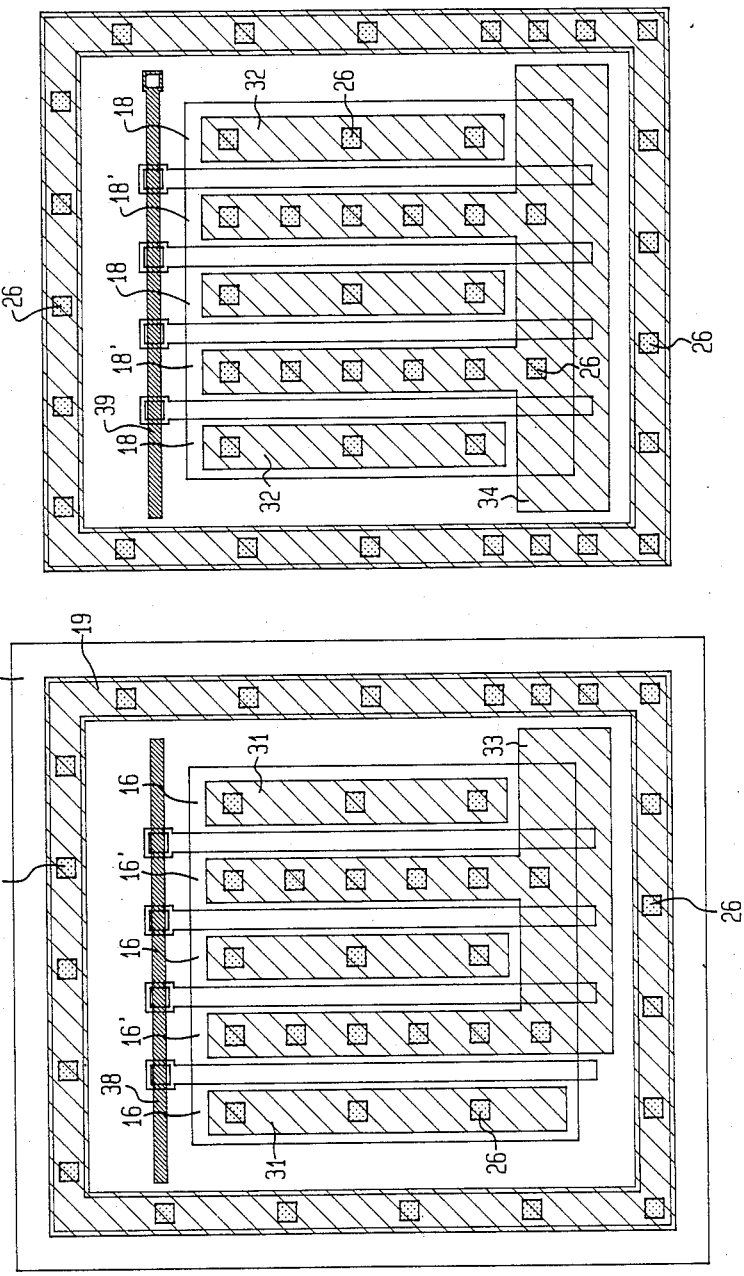
FIG. 3 is a plan view showing the complementary MOS integrated circuit according to the present invention at the manufacturing step after a first level wiring layer is formed.
Figure 4:
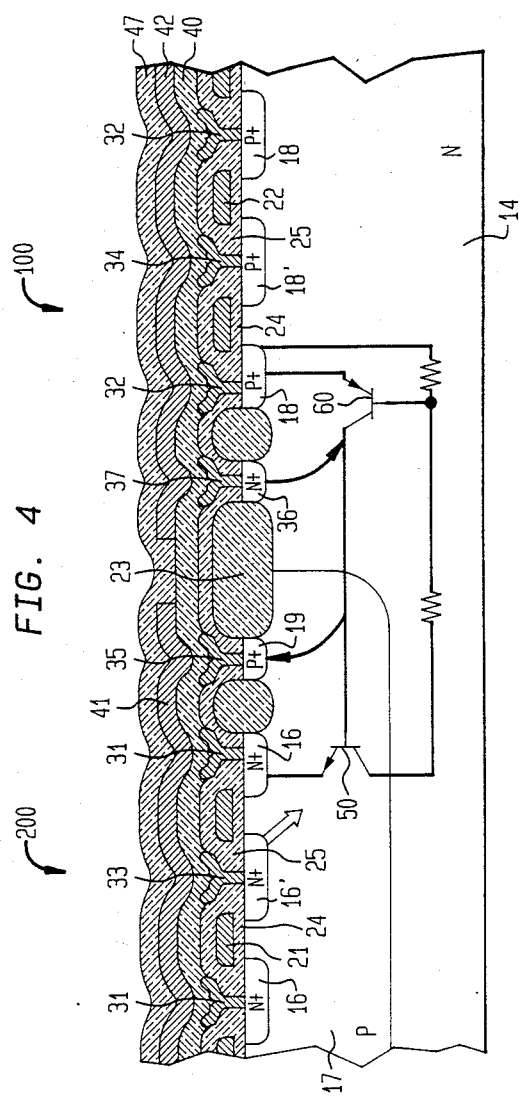
FIG. 4 is a sectional view taken along the line A—A' of FIG. 2.

As shown in FIG. 4, the thick oxide film 23 is formed on the surface region of the well region 17 and the substrate 14 except for the source regions 16, 16', the drain regions 18, 18' and the gate electrodes 21, 22 by a thermal oxidation process prior to the the formation of the source regions 16, 16', the drain region 18, 18' and the gate electrodes 21, 22. After the oxidation process, thin gate insulator film 24 of $SiO_2$ is formed on the well region 17 and the substrate 14, followed by the formation of the gate electrodes 21 and 22. Thereafter, the source regions 16, 16', the drain regions 18, 18', the P+-region 19 and the N+-region 36 are formed by ion implantation or an impurity diffusion. A first insulator film 25 is deposited all over the surface. The first insulator film 25 is a phosphosilicate glass having a thickness of 1 μm, for example. A plurality of first holes 26 are opened in the first insulator film 25 to expose the source and drain regions 16, 18, 16' and 18', the P+-region 19 and the N+-region 36. Especially, on the P+-region 19 and the N+-region 36, the first holes 26 are formed so as to surround the inside regions thereof. The distance between adjacent first holes are selected between 2 μm and 5 μm, preferably selected at 3 μm. A first wiring metal of Al is evaporated over the first insulator film 25 and the first holes 26 with a thickness of 0.5 μm, and then selectively etched to form source wirings 31 and 32, drain wirings 33 and 34, intermediate ring-shape wirings 35 and 37, and interconnections 38 and 39 of gate electrodes, as shown in FIGS. 2 and 3, especially in FIG. 3.

A second insulator film 40 is, thereafter, deposited with phosphosilicate glass having a thickness of 1 μm, for example. A plurality of second holes 27 are opened to expose the source wirings 31, 32, the drain wirings 33, 34, selected ones of the interconnections 38 and 39 and the intermediate ring-shape wirings 35 and 37. The second holes 27 on the source wirings 31, 32 and the intermediate ring-shape wirings 35 and 37 are generally disposed between the first holes 26. The distance between such second holes 27 are selected between 2 μm and 5 μm, preferably selected at 3 μm. Thereafter, a second wiring metal of Al is evaporated over the second insulator film 40 and the second holes 27 with a thickness of 1 μm, and then selectively etched to form a first upper wiring 41, a second upper wiring 42, an input wiring 43, a gate interconnection 44, a drain interconnection 45 and an output wiring 46. The first upper wiring 41 is connected to a terminal receiving a grounding potential. The second upper wiring 42 is connected to a terminal receiving a positive power voltage. The input wiring 43 is connected to other circuit or an input terminal. The output wiring 46 is connected to other circuit or an output terminal. Finally, a surface passivation 47 of $SiO_2$, for example, is deposited all over the surface except for terminals to be connected with external circuit.

Figure 5:
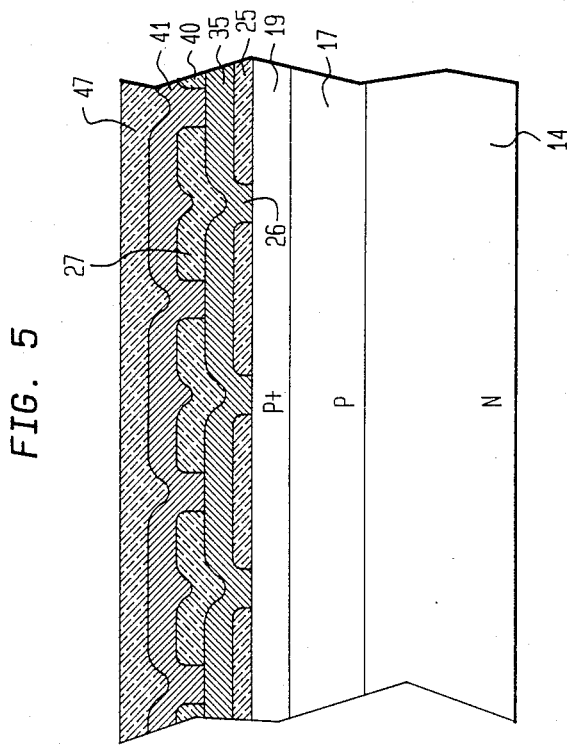
FIG. 5 is a sectional view taken along the line B—B' of FIG. 2.

The exact structure of the portion of P+-region 19 is shown in FIG. 5. The structure of the portion of N+-region 36 is similar to FIG. 5. The intermediate ring-shape wiring 35 is periodically connected with the P+-region 19 through the first holes 26. The first upper wiring 41 is also periodically connected with the intermediate ring-shape wiring 35. Therefore, the impedance between the P+-region 19 and the first upper wiring 41 is very reduced by a number of interconnecting paths therebetween through the intermediate ring-shape wiring 35. If the parasitic NPN bipolar transistor 50 formed of the N+ source region 16, the P-well region 17 and the N-substrate 14 is turned on, the collector current from the parasitic PNP bipolar transistor 60 formed of the P+ source region 18, the N-substrate and the P-well region 17 which is turned on by the turning-on of the NPN bipolar transistor 50, is effectively drained from the P+-region 19 to the grounding potential. Thus, the feed-back of the collector current from the PNP bipolar transistor 60 to the base of the NPN bipolar transistor 50 is kept small to prevent the PNPN thyristor from turning on.

Similarly, the N+-region 36 is connected with the second upper layer 42 with very small impedance through the intermediate ring-shape wiring 37, the carriers for recombining the carriers of the collector current from the PNP bipolar transistor 60 are effectively supplied from the N+-region 36. This carrier supply also dicreases the feed-back of the collector current of the PNP bipolar transistor 60 to the base of the NPN bipolar transistor, and, therefore, prevent more effectively the operation of the PNPN thyristor. Thus, the latch-up phenomenon is not generated so as to prevent the complementary MOS integrated circuit from being broken down.

The employment of the intermediate ring-shape wiring 35 gives another advantage of reliable interconnection between the P+-region 19 and the first upper wiring 41. If the intermediate ring-shape wiring 31 is not used, the first upper wiring 41 must be directly connected with the P+-region 19. The first and second insulator films 25 and 40 are interposed between the first upper wiring 41 and the P+-region 19. Therefore, the total thickness of the interposed insulator films 25 and 41 is large. The direct connection is apt to produce a disconnection of the first upper wiring 41 due to the large total thickness of interposed insulator films 25 and 41. Due to the presence of the intermediate ring-shape wiring 35, each wiring can be connected with other wiring or the P+-region 19 through a reduced thickness of insulator film. This reduces the opertunity of disconnection of each wiring. Thus, a reliable connection between the first upper wiring 41 and the P+-region 19.

The distances between the first holes 26 and between the second holes are selected within a range between 2 and 5 μm. The lower limit of 2 μm is based on the present lower limit according to the present manufacturing techniques. If possible, the lower limit of 2 μm can be more minimized. The upper limit of 5 μm is based on the fact that the reduction effect of the impedance between the upper wiring and the ring-shape high impurity region (19, 36) is weekened in the range of more than 5 μm.

One of the P+-region 19 and N+-region 36 may be removed. Although the employment of both regions 19 and 36 gives a reliable prevention of the latch-up phenomenon, one of them can perform a considerable effect of the prevention of the latch-up phenomenon. In this case, the N+-region 36 may be removed. The P+-region 19 and N+-region 36 may be respectively surround a plural number of MOS field effect transistors.

What is claimed is:
1. A MOS integrated circuit comprising:
a semi-conductor substrate of one conductivity type;
a well-region of another conductivity type formed in said semi-conductor substrate;

a first MOS field effect transistor of a first channel type formed in said well-region, said first MOS field effect transistor having source and drain regions of said one conductivity type;

a second MOS field effect transistor of another channel type formed in said semi-conductor substrate outside said well region, said second MOS field effect transistor having source and drain regions of said another conductivity type;

a high impurity region formed in said well region and having said another conductivity type, said high impurity region surrounding said first MOS field effect transistor;

a first insulator film covering said semiconductor substrate, said well-region, said first and second MOS field effect transistors and said high impurity region, said first insulator film having first holes exposing first contact portions of said drain regions in said first and second MOS field effect transistors and a plurality of second holes exposing a plurality of second contact portions of said high impurity region, said second holes being arranged to substantially surround said first MOS field effect transistor;

first wiring layers covering said first insulator film and connected with said first contact portions through said first holes;

a second wiring layer covering said first insulator film and connected with said second contact portions through said second holes, said second wiring layer substantially surrounding said first MOS field effect transistor;

a second insulator film covering said first and second wiring layers and having third holes exposing third contact portions of said first wiring layers and a plurality of fourth holes exposing a plurality of fourth contact portions of said second wiring layer, said fourth holes being arranged to substantially surround said first MOS field effect transistor;

a third wiring layer covering said second insulator film and connected with said third contact portions through said third holes, said third wiring layer crossing said high impurity region and interconnecting said first and second MOS field effect transistors to form an electrical circuit;

a fourth wiring layer covering said second insulator film and connected with said fourth contact portions through said fourth holes, said fourth wiring layer substantially surrounding said first MOS field effect transistor; and a means for supplying a constant potential to said fourth wiring layer.

2. A MOS integrated circuit as recited in claim 1, wherein said fourth holes are disposed between said second holes in plan view.

3. A MOS integrated circuit as recited in claim 1, further comprising:

another high impurity region formed in said semiconductor substrate outside said well-region, said other high impurity region substantially surrounding said second MOS field effect transistor and being covered with said first insulator film, said first insulator film further having a plurality of fifth holes exposing a plurality of fifth contact portions of said another high impurity region, and said fifth holes being arranged to substantially surround said second MOS field effect transistor;

a fifth wiring layer covering said third insulator film and connected with said fifth contact portions through said fifth contact holes, said third wiring layer substantially surrounding said second MOS field effect transistor, said fifth wiring layer being covered with said second insulator film, and said second insulator film further having a plurality of sixth holes exposing a plurality of sixth contact portions of said fifth wiring layer, said sixth holes substantially surrounding said second MOS field effect transistor, and said third wiring layer further crossing said another high impurity region;

a sixth wiring layer covering said second insulator film and connected with said third wiring layer through said sixth holes; and a means for supplying a power voltage to said sixth wiring layer.

4. A MOS integrated circuit as recited in claim 3 wherein said sixth holes are disposed between said fifth holes in plan view.

5. A MOS integrated circuit as recited in claim 4, wherein said second, fourth, fifth and sixth holes are respectively disposed with a spaced interval between 2 $\mu$m and 5 $\mu$m.

6. A MOS integrated circuit as recited in claim 4, wherein said fourth and sixth wiring layers cover, respectively, said first and second MOS field effect transistors.

* * * * *